(12) United States Patent
Koshido

(10) Patent No.: US 6,204,190 B1
(45) Date of Patent: Mar. 20, 2001

(54) METHOD FOR PRODUCING AN ELECTRONIC DEVICE

(75) Inventor: Yoshihiro Koshido, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/353,999

(22) Filed: Jul. 16, 1999

(30) Foreign Application Priority Data

Aug. 20, 1998 (JP) .................................................. 10-234191

(51) Int. Cl.$^7$ .................................................... H01L 21/00
(52) U.S. Cl. ............................ 438/712; 216/57; 438/690; 438/720; 438/734; 438/742
(58) Field of Search ..................................... 438/690, 712, 438/720, 734, 742; 216/57, 67, 77

(56) References Cited

U.S. PATENT DOCUMENTS 4,863,557 * 9/1989 Kokaku et al. ..................... 216/77 X
5,411,631 * 5/1995 Hori et al. .......................... 216/77 X

* cited by examiner

*Primary Examiner*—William Powell
(74) *Attorney, Agent, or Firm*—Ostrolenk, Faber, Gerb & Soffen, LLP

(57) ABSTRACT

A method for producing an electronic device, comprises the steps of: depositing a thin film on a substrate; etching a portion of the thin film by a reactive ion etching so as to leave a remaining portion of the thin film behind; and removing the remaining thin film by a physical etching using an inert gas.

16 Claims, 2 Drawing Sheets

METHOD FOR PRODUCING AN ELECTRONIC DEVICE

BACKGROUND OF THE INVENTION

1. Field of the Invention

The present invention relates to a method for producing an electronic device. In more detail, the present invention relates to a method for producing an electronic device such as a semiconductor integrated circuit, a semiconductor device or a surface acoustic wave (SAW) device.

2. Description of the Related Art

Various electronic devices comprise patterned electrodes or metallizations on a substrate. For example, in the case of a surface acoustic wave device, an aluminum electrode is formed on a single crystal piezoelectric substrate by reactive ion etching (RIE). More specifically, as shown in FIGS. 1A and 1B, the surface of an electrode film 2 provided on a single crystal piezoelectric substrate 1 is covered with a photoresist 3, and the electrode film 2 is selectively etched using a chlorine-based gas such as $Cl_2$ or $BCl_3$ and the patterned photoresist 3 as a mask. However, the electrode film 2 is not always completely removed and is sometimes left behind on the single crystal substrate 1 owing to heterogeneous distributions of the film thickness of the electrode film 2 or reactive ion etching rate on the surface of the single crystal substrate 1 as shown in FIG. 1A. A residue eliminating process called over-etching becomes therefore inevitable in order to completely remove the electrode film 2 without leaving any residues behind. An over-etching treatment by 5 to 50% excess of the overall etching time under the same etching condition is applied in the over-etching method, as shown in FIG. 1B, thereby slightly etching into the single crystal substrate 1.

The portions where the electrode film 2 has been removed and the single crystal substrate 1 has been exposed are exposed to chlorine plasma during the over-etching time. Consequently, the single crystal substrate 1 is damaged forming damaged layers 4 as shown in FIG. 2, thereby deteriorating characteristics of the acoustic surface wave device.

It has been a common view that the cause of the substrate damage due to over-etching described above is a physical damage caused by impact of ions colliding with the substrate during the reactive ion etching. Accordingly, the substrate damage due to ion irradiation has been suppressed by the methods of: (1) reducing the ion irradiation energy; (2) improving homogeneity of the ion etching rate; and (3) detecting the etching terminal point with high precision. However, it was impossible to completely inhibit the damage of the substrate by the conventional methods, although it can be reduced.

SUMMARY OF THE INVENTION

The present invention is directed to a method that can solve the aforementioned problem and reduce the damage of the substrate by the reactive ion etching during production of an electronic device. The method for producing an electronic device, comprises the steps of: depositing a thin film on a single crystal substrate or single crystal film, or on a triaxial or uniaxial orientation film; etching the a portion of the thin film by a reactive ion etching so as to leave a remaining portion of the thin film behind; and removing the remaining thin film by a physical etching using an inert gas as the principal gas.

In the method, it is preferable to use a chlorine-based gas for the reactive ion etching, and that the physical etching is carried out by ion milling.

In addition, the thin film left behind after the reactive ion etching preferably has a film thickness in the range from about 0.5 nm through about 1000 nm and more preferably about 1–500 nm.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1A:
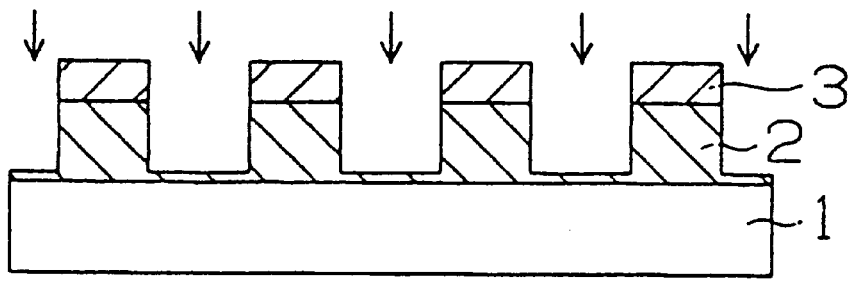
FIGS. 1A and 1B are cross sectional views showing the reactive ion etching steps using a chlorine-based gas in the conventional art.
Figure 1B:
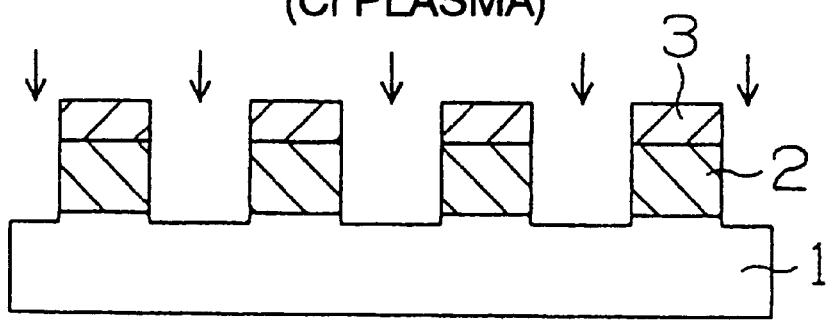
Figure 2:
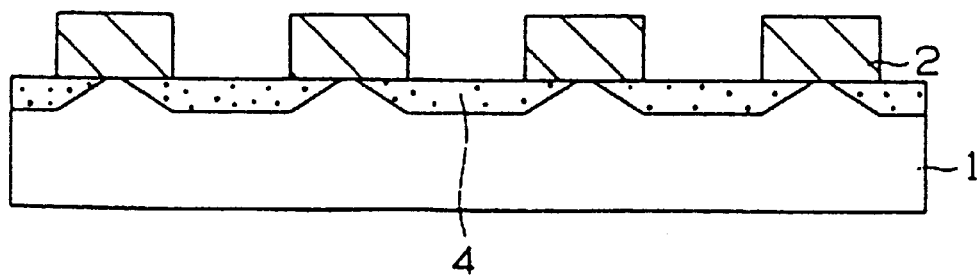
FIG. 2 is a cross sectional view of a substrate damaged by over-etching.

The inventor of the present invention has found, through collective studies, that the damage of the substrate is not simply caused by a physical damage due to collision of ions onto the substrate, but is caused by a diffusion of chlorine species (ions, atoms, molecules or chlorine radicals) into the substrate. According to the study, it is thought that chlorine is diffused into the substrate by exposing the surface of the substrate to the chlorine ions during the reactive ion etching and this destroys or impairs the crystallinity of the substrate. As a result, various properties which appeared to be due to high crystallinity, such as piezoelectric properties, dielectric properties, pyroelectric properties, semiconductor properties, magnetic properties or the like, are caused to degrade.

The method for producing the electronic device according to the present invention is based on the facts found by the inventor of the present invention. The method comprises the steps of: etching a thin film which is deposited on a single crystal substrate or single crystal film, or on a triaxial orientation film or uniaxial orientation film, by a reactive ion etching so as to leave a part of the thin film behind; and removing the remaining thin film by a physical etching using an inert gas as the principal gas. Functional single crystal materials such as piezoelectric substances, dielectric substances, pyroelectric substances, semiconductors and magnetic substances are suitably used for the single crystal substrate or single crystal film, or for the triaxial or uniaxial orientation film depending on the kind of the electronic device.

According to the study by the inventor, the present invention is more preferably applied to an surface acoustic wave device having a piezoelectric substrate or film made of a material such as $LiTaO_3$, $LiNbO_3$, $Li_2B_4O_7$, quartz, or $La_3Ga_5SiO_{14}$ (Langasite). This is because these materials is susceptible to chlorine diffusion by the reactive ion etching to result in degradation of the piezoelectric properties.

Plasma of a chlorine-based gas is usually used for the reactive ion etching. The chlorine-based gas as used herein refers to a gas containing chlorine, for example a gas containing at least one of $Cl_2$, $BCl_3$, $SiCl_4$, $CCl_4$, $CClF_3$, $CHClF_2$, $CCl_2F_2$, $CHCl_2F$, $CHCl_3$, $CCl_3F$ and $CH_2Cl_2$.

A thin film formed on the single crystal substrate or single crystal film, or on the triaxial or uniaxial orientation film may be a conductive material or semiconductor containing at least one element capable of reactive ion etching with a chlorine-based gas, examples of which include at least one element among Al, Cu, Ti, Cr, Ga, As, Se, Nb, Ru, In, Sn, Sb, Ta or Au.

Since a part of the thin film is left behind in the reactive ion etching of the thin film according to the present invention, the single crystal thin film or the like is not exposed to ions, preventing the single crystal thin film or the like from being damaged. A trace amount of the remaining thin film is further removed by a physical etching using an inert gas as the principal gas.

One example of the physical etching using an inert gas is ion milling. Ion milling refers to a physical etching by which ions of the inert gas collides with an object to flip off (sputter) the surface substances on the object without being accompanied by any chemical reactions. Accordingly, the gas used for ion milling may contain one or more of the elements among Ar, Kr, Xe and Ne. However, a small amount of a chlorine-based gas may be added to the inert gas to apply a reactive ion etching (RIE) or an ion-beam etching. The amount of the chlorine-based gas should be so small as to cause no problems of deterioration of characteristics of the single crystalline substrate and single crystalline film.

Since damage of the substrate by the reactive ion etching has been commonly considered to be physical damage caused by ion collision, removing the thin film all over the substrate by applying a physical etching such as ion milling at the final step was thought to enlarge the damage of the substrate. However, the damage of the substrate by reactive ion etching is actually caused by chemical damage. Accordingly, removing the final thin film by the physical etching allows the thin film to be completely removed without exerting damage on the substrate, improving the characteristics of the electronic device.

The preferable thickness of the thin film to be left behind after the reactive ion etching is in the range of from about 0.5 nm through about 1000 nm. When the target thickness is thinner than about 0.5 nm, the thin film may be perforated due to distribution of the reactive ion etching rate while, when the thickness is larger than about 1000 nm, the physical etching processing time may become too long.

Figure 3A:
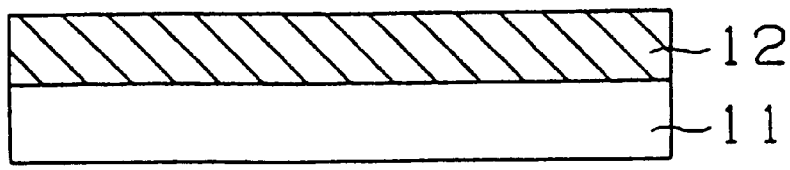
FIGS. 3A to 3E are cross sectional views showing the electrode forming steps according to one embodiment of the present invention.
Figure 3B:
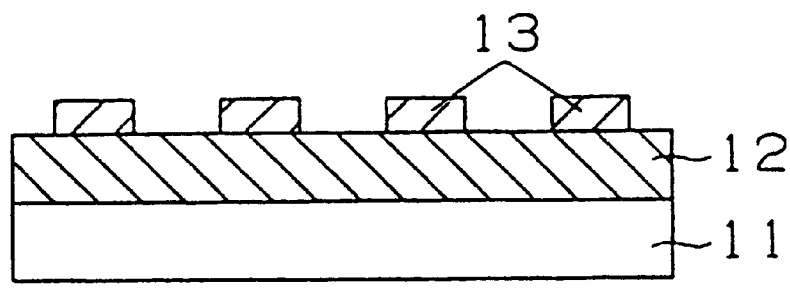

Hereinafter, an embodiment of the present invention will be described in more detail with reference to the attached drawings using the acoustic surface wave device as an example. As shown in FIG. 3A, an electrode film 12 made of Al containing 1% by weight (1 wt %) of Cu (referred to Al-1 wt %Cu hereinafter) is deposited to be a film thickness of 100 nm by sputtering on a LiTiO$_3$ substrate 11 having a diameter of three inches. Then, a photoresist is coated on the electrode film 12 consisting of Al-1 wt %Cu, as shown in FIG. 3B, to form a resist pattern 13 with a line width (L/S) of 0.5 μm and film thickness of 1 μm by a photolithographic process.

Figure 3C:
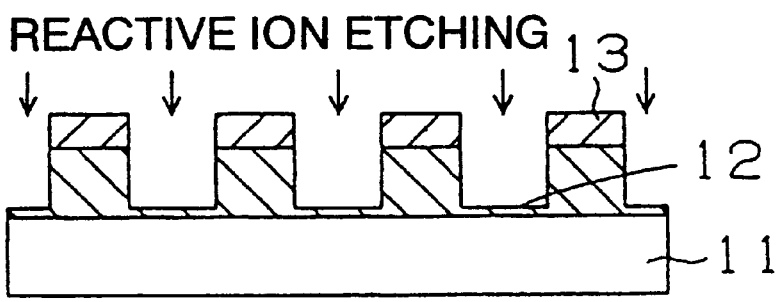

The electrode film 12 is subjected to the reactive ion etching thereafter as shown in FIG. 3C using the resist pattern 13 as a mask. The electrode film 12 is removed halfway by applying the reactive ion etching so as to leave 20 nm of the film thickness behind. The reactive ion etching is carried out with a parallel plate RIE apparatus using a mixed gas with a composition of (BCl$_3$+Cl$_2$+N$_2$). It is needless to say that ICP, ECR or Helicon may be used instead of the parallel plate RIE apparatus.

Since the LiTaO$_3$ substrate 11 is covered with the electrode film 12 and is not exposed during the reactive ion etching, the LiTaO$_3$ substrate 11 is not exposed to the chlorine plasma while applying the reactive ion etching with a mixed gas containing the chlorine-based gas, giving no damage to the plate.

Figure 3D:
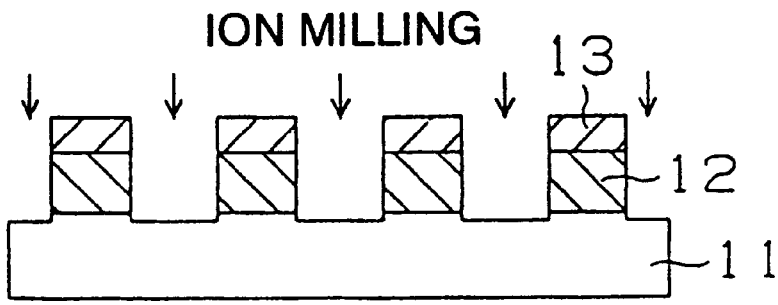

After completely evacuating the mixed gas of (BCl$_3$+Cl$_2$+N$_2$) from the chamber of the RIE apparatus and before exposing the LiTaO$_3$ substrate 11 to the air, it is subjected to an Ar ion milling to remove the electrode film 12 to the extent of slight over-etching as shown in FIG. 3D. The Ar ion milling is carried out by an ion-shower method using a ECR plasma source. Of course, other high density plasma sources may be used. An ion pull-in method by which a RF or DC bias is applied on the substrate may be used instead of the ion-shower method. The over-etching time was set to 30% of the total ion milling time.

It was confirmed from the inventor's studies that the physical damage at the portion where the electrode film 12 has been removed does not largely affect the device characteristics. Accordingly, a sufficient over-etching is applied when the remaining electrode film 12 is removed by the ion milling to completely remove the residues of the electrode film 12.

Figure 3E:
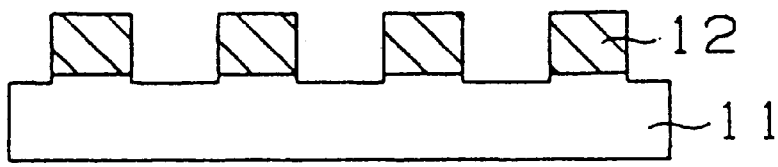

A comb-teeth shaped electrode having a pattern of the electrode film 12 is obtained as shown in FIG. 3E by removing off the resist pattern 12 with a resist peeling solution. This substrate (parent plate) 11 is cut-off, assembled and wired to obtain the acoustic surface wave device.

As hitherto described, good device characteristics can be obtained in the foregoing embodiment irrespective of applying a sufficient over-etching treatment by the ion milling. In the conventional art, on the other hand, the substrate is chemically damaged with the chlorine plasma when an over-etching of 30% is applied, resulting in severe deterioration of the device characteristics (such as insertion loss).

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for producing an electronic device, comprising the steps of:
    depositing a thin film on a substrate;
    etching a portion of the thin film by a reactive ion etching so as to leave a portion of the thin film on the substrate; and
    removing the remaining thin film by inert gas physical etching.

2. A method for producing an electronic device according to claim 1, wherein the reactive ion etching is effected with a chlorine-containing gas.

3. A method for producing an electronic device according to claim 2, wherein the physical etching is ion milling.

4. A method for producing an electronic device according to claim 3, wherein the thin film after the reactive ion etching has a film thickness in the range from about 0.5 nm through about 1000 nm.

5. A method for producing an electronic device according to claim 4, wherein the thin film after the reactive ion etching has a film thickness in the range from about 1–500 nm.

6. A method for producing an electronic device according to claim 5, wherein the physical etching comprises over-etching.

7. A method for producing an electronic device according to claim 6, further comprising the step of forming a mask having a pattern on the thin film, wherein the etching step and the removing step are performed through the mask.

8. A method for producing an electronic device according to claim 7, wherein the substrate is a piezoelectric substrate.

9. A method for producing an electronic device according to claim 8, wherein the thin film comprises aluminum.

10. A method for producing an electronic device according to claim 9, wherein the substrate comprises $LiTiO_3$ and the ion milling is Ar ion milling.

11. A method for producing an electronic device according to claim 1, wherein the electronic device is a surface acoustic wave device.

12. A method for producing an electronic device according to claim 1, wherein the substrate is a single crystal substrate or film.

13. A method for producing an electronic device according to claim 1, wherein the substrate is a triaxial or uniaxial orientation film.

14. A method for producing an electronic device according to claim 1, wherein the physical etching comprises over-etching.

15. A method for producing an electronic device according to claim 1, wherein the physical etching is ion milling.

16. A method for producing an electronic device according to claim 1, wherein the thin film after the reactive ion etching has a film thickness in the range from about 0.5 nm through about 1000 nm.

* * * * *